United States Patent
Cheng et al.

(10) Patent No.: US 9,472,665 B2
(45) Date of Patent: Oct. 18, 2016

(54) MOS TRANSISTOR AND METHOD FOR MANUFACTURING MOS TRANSISTOR

(71) Applicant: TAIWAN SEMICONDUCTOR MANUFACTURING CO., LTD., Hsinchu (TW)

(72) Inventors: Chih-Chang Cheng, Hsinchu (TW); Fu-Yu Chu, Hsinchu (TW); Ruey-Hsin Liu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 225 days.

(21) Appl. No.: 14/024,872

(22) Filed: Sep. 12, 2013

(65) Prior Publication Data

US 2015/0069507 A1    Mar. 12, 2015

(51) Int. Cl.
| | |
|---|---|
| H01L 29/78 | (2006.01) |
| H01L 21/28 | (2006.01) |
| H01L 29/49 | (2006.01) |
| H01L 29/66 | (2006.01) |
| H01L 29/06 | (2006.01) |
| H01L 29/40 | (2006.01) |

(52) U.S. Cl.
CPC ..... *H01L 29/7835* (2013.01); *H01L 21/28052* (2013.01); *H01L 21/28105* (2013.01); *H01L 29/0653* (2013.01); *H01L 29/4933* (2013.01); *H01L 29/4983* (2013.01); *H01L 29/66659* (2013.01); *H01L 29/7833* (2013.01); *H01L 29/402* (2013.01)

(58) Field of Classification Search
CPC ........... H01L 29/7816; H01L 29/7835; H01L 29/66659; H01L 29/66681–29/66704
See application file for complete search history.

(56) References Cited

U.S. PATENT DOCUMENTS

| | | | | | |
|---|---|---|---|---|---|
| 5,355,007 | A | * | 10/1994 | Smayling | ............ H01L 29/7883 257/319 |
| 2011/0008944 | A1 | * | 1/2011 | Su | ........................ H01L 29/4983 438/306 |
| 2013/0181286 | A1 | * | 7/2013 | Zhang | ................. H01L 29/4983 257/335 |
| 2013/0341714 | A1 | * | 12/2013 | Jang | .................... H01L 29/7816 257/335 |

* cited by examiner

*Primary Examiner* — Stephen W Smoot
*Assistant Examiner* — Sun M Kim
(74) *Attorney, Agent, or Firm* — McDermott Will & Emery LLP

(57) ABSTRACT

A novel MOS transistor, which includes a source region, a drain region, a channel region, an isolation region, a drift region, a gate dielectric layer, a gate electrode and a field plate, is provided. The gate electrode has a first portion and a second portion. The first portion of a first conductivity type is located over the channel region and has a width equal to or greater than a distance of the gate electrode overlapped with the channel region. The second portion is un-doped and located over the isolation region. Accordingly, the MOS transistor allows higher process freedom saves production cost, as well as improves reliability.

17 Claims, 5 Drawing Sheets

MOS TRANSISTOR AND METHOD FOR MANUFACTURING MOS TRANSISTOR

BACKGROUND

Description of Related Art

High voltage metal-oxide-semiconductor (MOS) transistors, such as laterally diffused metal oxide semiconductor (LDMOS) transistors, are widely used in applications like automobile industry, display drivers, portable telecommunication devices and medical equipment. The LDMOS transistors are often utilized for high-voltage applications. Therefore, it is desirable that LDMOS transistors possess higher breakdown voltages to support other electrical devices that operate at high voltages. Breakdown voltage is the voltage level at which an uncontrollable increase in current through the LDMOS transistor occurs.

In order to increase device breakdown voltage of the LDMOS transistor, a metal field plate should be added on an inter-layer dielectric (ILD) layer that covers a gate electrode, so as to release device electric field. Nevertheless, the metal field plate is formed by a photomask process, which limits manufacturing process freedom and leads to a high production cost. Accordingly, there is a need for improved MOS transistor structures capable of releasing device electric field and formed without the photomask process to save production cost.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a field plate includes embodiments having two or more such field plates, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

The present disclosure relates to a laterally diffused metal oxide semiconductor (LDMOS) transistor and a method for manufacturing the same. The variations of the LDMOS transistor in accordance with embodiments are discussed. The various stages of fabricating the LDMOS transistor are illustrated. Throughout the various views and illustrative embodiments, like reference numbers are used to designate like elements.

Figure 1:
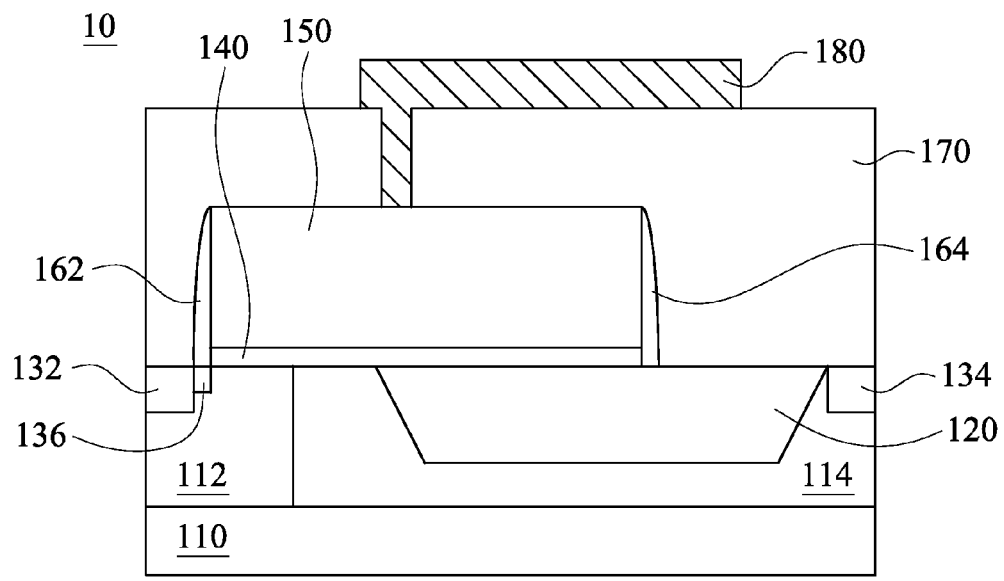
FIG. 1 is a cross-sectional view of a general MOS transistor.

FIG. 1 is a cross-sectional view of a general MOS transistor 10. The MOS transistor 10 includes a semiconductor substrate 110, a channel region 112, a drift region 114, an isolation region 120, a source region 132, a drain region 134, a lightly doped drain (LDD) region 136, a gate dielectric layer 140, a gate electrode 150 and spacers 162, 164. In order to increase device breakdown voltage, a metal field plate 180 is added on an inter-layer dielectric (ILD) layer 170 to help release device electric field. Nevertheless, the metal field plate 180 may be fabricated by a photomask process, and thus limits process freedom and leads to a high production cost. Furthermore, a thickness of the ILD layer 170 is generally determined by other process conditions such that device breakdown voltage tuning is limited.

Figure 2:
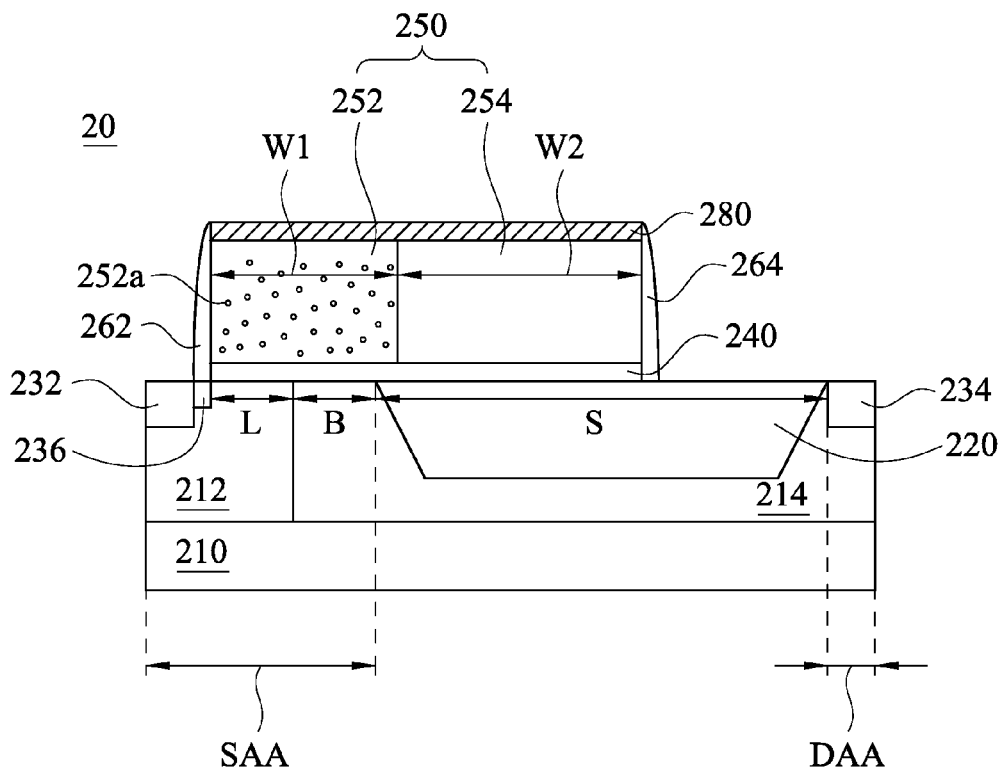
FIG. 2 is a cross-sectional view of a MOS transistor according to various embodiments of the present disclosure.

FIG. 2 is a cross-sectional view of a MOS transistor 20 according to various embodiments of the present disclosure. The MOS transistor 20 is a LDMOS transistor configuration for high-voltage (e.g., 50-1000 volts) applications. The MOS transistor 20 includes a semiconductor substrate 210, a channel region 212, a drift region 214, an isolation region 220, a source region 232, a drain region 234, a LDD region 236, a gate dielectric layer 240, a gate electrode 250, spacers 262, 264 and a field plate 280.

The semiconductor substrate 210 may be made of semiconductor material such as silicon, germanium, silicon germanium, silicon carbide and those consisting essentially of III-V compound semiconductors (e.g., GaAs and Si/Ge). The semiconductor substrate 210 may be amorphous, polycrystalline or single-crystalline. The semiconductor substrate 210 may be of N-type or P-type. In one embodiment, the MOS transistor 20 is an N-type MOS transistor and fabricated in a P-type semiconductor substrate 210.

The isolation region 220 is located in the semiconductor substrate 210 and adjacent to the drain region 234. The isolation region 220 may include an oxide or nitride material. The isolation region 220 is utilized to reduce device electric field near the drain region 234. In one embodiment, the isolation region 220 is a shallow-trench isolation (STI) region. In another embodiment, the isolation region 220 is a field oxide (FOX) region.

The source region 232 of a first conductivity type and the drain region 234 of the first conductivity type are disposed in the semiconductor substrate 210. In the embodiment that the MOS transistor 20 is an N-type MOS transistor, the source region 232 and the drain region 234 are doped with N-type dopants, such as arsenic, phosphorus, antimony or a combination thereof with a doping concentration from about $10^{13}$ cm$^{-3}$ to about $10^{15}$ cm$^{-3}$.

The channel region 212 of a second conductivity type opposite to the first conductivity type is located in the semiconductor substrate 210 between the source region 232 and the drain region 234. Specifically, the channel region 212 extends along an upper surface of the semiconductor substrate 210, between the facing edges of the source region 232 and the drift region 214. In the embodiment that the MOS transistor 20 is an N-type MOS transistor, the channel region 212 is doped with P-type dopants; in other words, the channel region 212 is considered as a P-type well (PW) region.

The drift region 214 of the first conductivity type is acted as an extension region of the drain region 234, which is disposed laterally adjacent to the channel region 212 and beneath the isolation region 220 and the drain region 234. The doping profile of the drift region 214 is beneath the drain region 234 and surrounds the isolation region 220. In the embodiment that the MOS transistor 20 is an N-type MOS transistor, the drift region 214 is doped with N-type dopants such as arsenic, phosphrous, antimony or a combination thereof with a doping concentration less than that of the drain region 234; that is, the drift region 214 may be or an N-well (NW) region or a high voltage N-well (HVNW) region.

The gate dielectric layer 240 is disposed over the channel region 212 and extends over the drift region 214 and the isolation region 220. In other words, the gate dielectric layer 240 extends from a location adjacent to the source region 232, along the upper surface of the semiconductor substrate 210, to a location on the isolation region 220 and adjacent to the drain region 234. The gate dielectric layer 240 may be formed by thermal grown method or deposition. As an example, the gate dielectric layer 240 may be made of thermally grown material including silicon dioxide or silicon nitride, or deposited by chemical vapor deposition (CVD), such as plasma enhanced CVD (PECVD), low pressure CVD (LPCVD) or atmosphere pressure CVD (APCVD).

The gate electrode 250 is disposed over the gate dielectric layer 240. Specifically, the gate electrode 250 extends from a location aligned with one end of the gate dielectric layer 240 close to the source region 232, along the surface of the channel region 212, the surface of the drift region 214 and the surface of the isolation region 220, to a location aligned with the other end of the gate dielectric layer 240 on the isolation region 220. The gate electrode 250 may be made of a conductive material such as polysilicon (poly), metal or metal alloy. In one embodiment, the gate electrode 250 includes polysilicon. In various embodiments, the gate electrode 250 has a thickness in a range of 500 to 10,000 angstroms.

The field plate 280 is disposed on and contacts an upper surface of the gate electrode 250. The field plate 280 includes polycide, for an example, the polycide may be a material selected from the group consisting of cobalt silicide, titanium silicide, tungsten silicide, nickel silicide and a combination thereof. The field plate 280 may be made of any conventional process such as salicide process rather than a photomask process, so as to save production cost and to allow more process freedom. As a result, in some embodiments, the gate electrode 250 and the field plate 280 are substantially identical in pattern in a top view. In some embodiments, the field plate 280 has a thickness in a range of 10 to 300 angstroms.

In various embodiments, as a particular feature the gate electrode 250 has a first portion 252 of the first conductivity type over the channel region 212 and an un-doped second portion 254 over the isolation region 220. Thus, the second portion 254 of the gate electrode 250 has a resistance greater than a resistance of the first portion 252 of the gate electrode 250. The second portion 254 is acted as a high resistance-gate when the MOS transistor 20 is in the "on" state, and acted as a high resistance layer when the MOS transistor 20 in the "off" state. That is, the second portion 254 has a similar function as the ILD layer 170 of FIG. 1 when the MOS transistor 20 is in the "off" state. Additionally, it is noteworthy that, because a thickness of the second portion 254 could be adjusted without concerning other process conditions, the breakdown voltage tuning is easier than that of the general MOS transistor 10. In the embodiment that the MOS transistor 20 is an N-type MOS transistor, the first portion 252 is doped with N-type dopants 252a.

The gate electrode 250 has a width (i.e., a sum of a width W1 of the first portion 252 and a width W2 of the second portion 254) less than a sum of a distance L of the gate electrode 250 overlapped with the channel region 212, a clearance B between the channel region 212 and the isolation region 220, and a lateral dimension S of the isolation region 220 (i.e., W1+W2<L+B+S). In various embodiments, as shown in FIG. 2, a source active area SAA includes the source region 232, the LDD region 236, a portion of the channel region 212 under the gate electrode 250, as well as a portion of the drift region 214 between the isolation region 220 and the channel region 212; a drain active area DAA includes the drain region 234. Thus, the lateral dimension S may also be defined as the space between the source active area SAA and the drain active area DAA.

In various embodiments of the present disclosure, the first portion 252 has a limitation that the width W1 of the first portion 252 is equal to or greater than the distance L of the gate electrode 250 overlapped with the channel region 212 (i.e., W1≥L). In another aspect, the width W1 is less than a sum of the distance L, the clearance B between the channel region 212 and the isolation region 220, and the lateral dimension S of the isolation region 220 (i.e., W1<L+B+S). In the illustrated embodiment, the width W1 is greater than the distance L plus the clearance B (i.e., W1>L+B). That is, the first portion 252 of the gate electrode 250 further extends over a portion of the drift region 214 and a portion of the isolation region 220.

The MOS transistor 20 may selectively includes a LDD region 236 formed beneath the spacer 262, adjoining the source region 232. In the embodiment that the MOS transistor 20 is an N-type MOS transistor, the LDD region 236 is an N-type lightly doped drain (NLDD) region.

The spacer 262 is provided on the LDD region 236 and contacting a sidewall of the first portion 252 of the gate electrode 250; the spacer 264 is provided on the isolation region 220 and contacting a sidewall of the second portion 254 of the gate electrode 250. Silicon nitride or silicon dioxide may be employed to make the spacers 262, 264.

Figure 3:
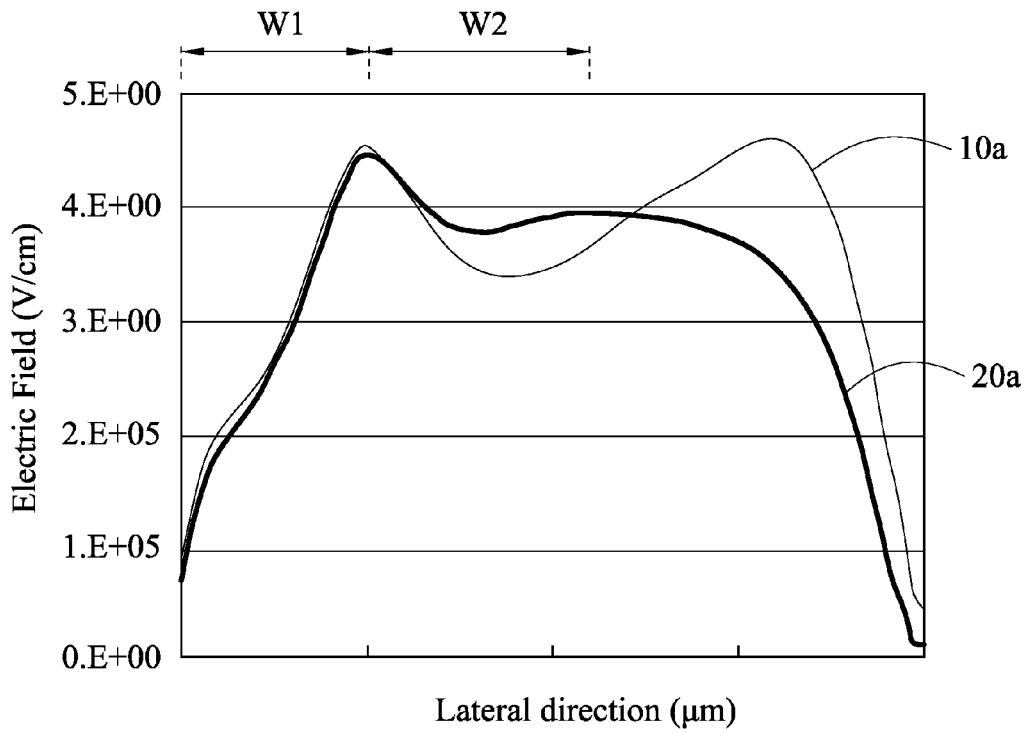
FIG. 3 is a relationship diagram between electric field and lateral direction of a comparative MOS transistor and a MOS transistor according to various embodiments of the present disclosure.

FIG. 3 is a relationship diagram between electric field and lateral direction of a comparative MOS transistor and a MOS transistor 20. The electric field is measured from a location adjacent to the source region to a location adjacent to the drain region. The comparative MOS transistor has a same gate structure as that of the MOS transistor 20, the ILD layer 170 and the metal field plate 180 of FIG. 1. As shown in FIG. 3, a curve 10a of the comparative MOS transistor has two peak values, in which the maximum electric field (i.e., right peak value) occurs at a location outside the gate electrode 250. A curve 20a of the MOS transistor 20 has a maximum electric field occurs at a junction between the first portion 252 and the second portion 254, which is similar to the left peak value of the curve 10a. In some embodiments, the electric field at a location outside the gate electrode 250 of the MOS transistor 20 is less than that of the comparative MOS transistor about 14%, such that the MOS transistor 20 has better reliability than that of the comparative MOS transistor. As mentioned above, the field plate 280 directly disposed on the gate electrode 250 can be used to reduce the electric field outside the gate electrode so as to improve reliability.

Figure 4:
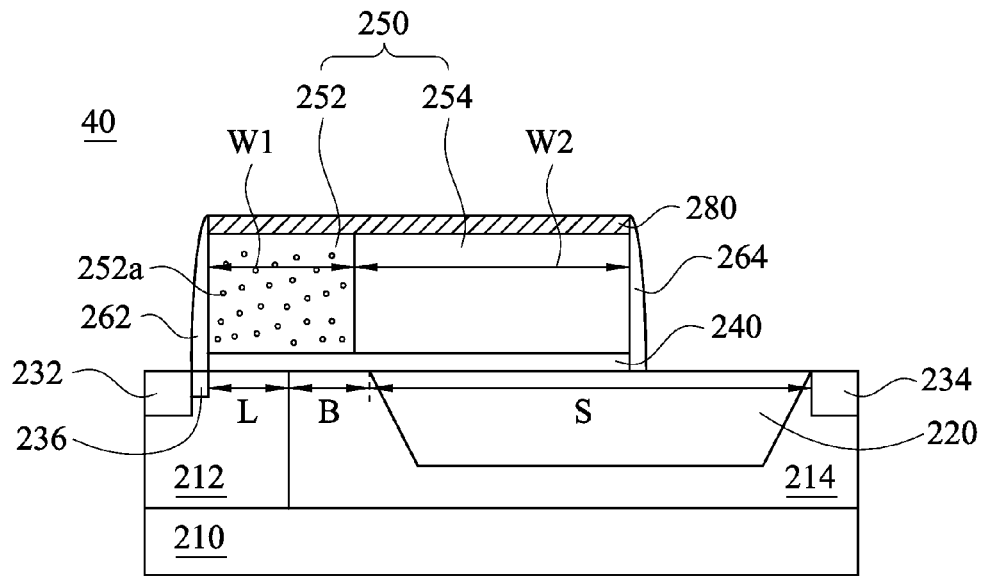
FIG. 4 is a cross-sectional view of a MOS transistor according to various embodiments of the present disclosure.

FIG. 4 is a cross-sectional view of a MOS transistor 40 according to various embodiments of the present disclosure. The difference between the MOS transistor 40 and the MOS transistor 20 is that the MOS transistor 40 has a width W1 of the first portion 252 of the gate electrode 250 less than the distance L of the gate electrode 250 overlapped with the channel region 212 plus the clearance B between the channel region 212 and the isolation region 220 (i.e., W1<L+B). Generally, to have better electrical performance, the width W1 is as great as possible and the distance L is as small as possible according to various embodiments of the present disclosure. It is noted that, in practical applications, the ratio of width W1 and the width W2 can be arbitrarily adjusted to meet a need for the improvements of a voltage breakdown, and thus not limited to the embodiments shown in the embodiments of the present disclosure.

FIGS. 5A-5F are cross-sectional views at various stages of manufacturing the MOS transistor 20. To clarify description and avoid repetition, like numerals and letters used to describe the MOS transistor 20 above are used for the various elements in the coming figures. Also, reference numerals described previously may not be described again in detail herein.

Figure 5A:
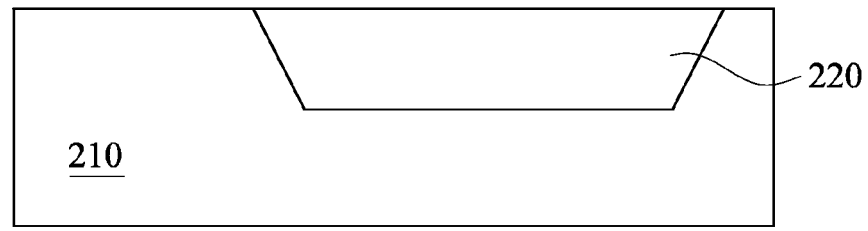
FIGS. 5A-5F are cross-sectional views at various stages of manufacturing a MOS transistor according to various embodiments of the present disclosure.

As shown in FIG. 5A, a semiconductor substrate 210 is provided, and an isolation region 220 is then formed therein. For an example, selective oxidation may be performed to form the isolation region 220 (e.g., a STI region or a FOX region).

Figure 5B:
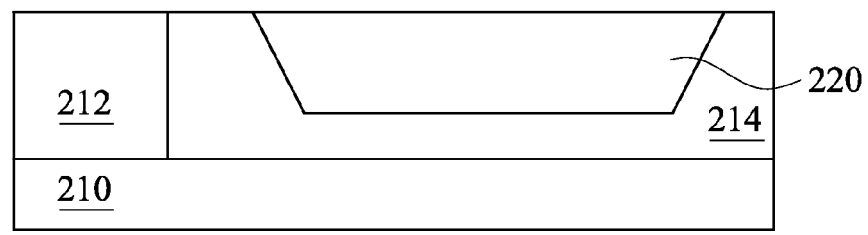

Next, as shown in FIG. 5B, a drift region 214 is formed by implanting first conductivity type dopants in a selective area of the semiconductor substrate 210. The drift region 214 is laterally adjacent to a channel region 212 and beneath the isolation region 220, and is acted as an extension of a drain region to be formed subsequently. In various embodiments, a channel region 212 is formed by implanting second conductivity type dopants in another selective area of the semiconductor substrate 210 prior or next to the step of forming the drift region 214.

Figure 5C:
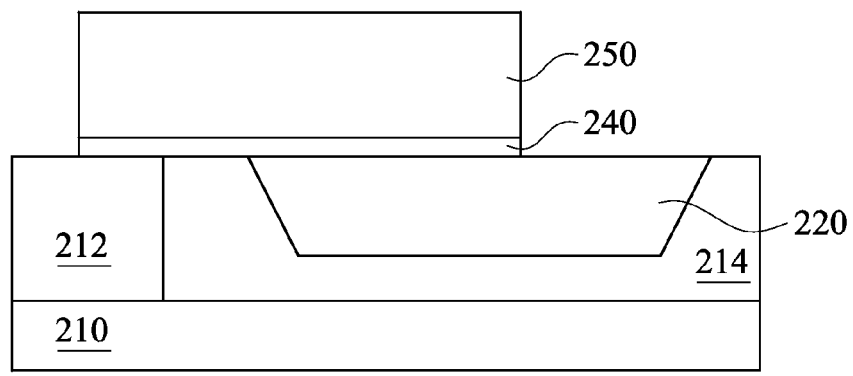

Continuing in FIG. 5C, a gate dielectric layer 240 is deposited over the channel region 212 and the drift region 214, and a gate electrode 250 is formed over the gate dielectric layer 240. For an instance, a gate dielectric material layer (not shown) is formed on the channel region 212 and the drift region 214 by thermally grown or by deposition. Subsequently, a gate layer (not shown, e.g., a polysilicon layer) is deposited on the gate dielectric material layer and then patterned to form the gate electrode 250. Sequentially, the gate electrode 250 is acted as a mask, and the gate dielectric material layer is dry etched to form the gate dielectric layer 240 beneath the gate electrode 250.

Figure 5D:
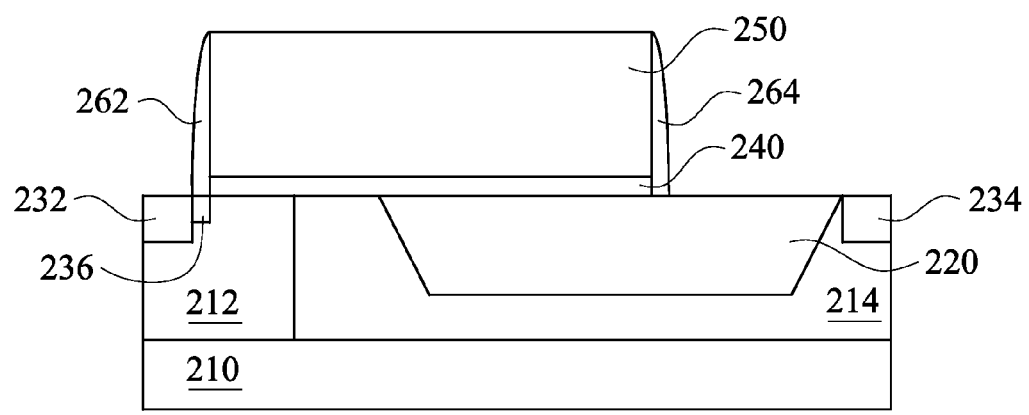

Referring now to FIG. 5D, a lightly doped drain (LDD) region 236, first and second spacers 262, 264, a source region 232 and a drain region 234 are formed by any conventional method. For example, a lightly ion implantation process is performed by implanting the dopants of the first conductivity type to a selective area of the channel region 212 to form the LDD region 236. Next, deposition, photolithographic and etching processes are sequentially performed to form the first and second spacers 262, 264 at the opposite sidewalls of the gate electrode 250. The dopants of the first conductivity type are then respectively implanted into a selective area of the channel region 212 and a selective area of the drift region 214 to form the source region 232 and the drain region 234.

Figure 5E:
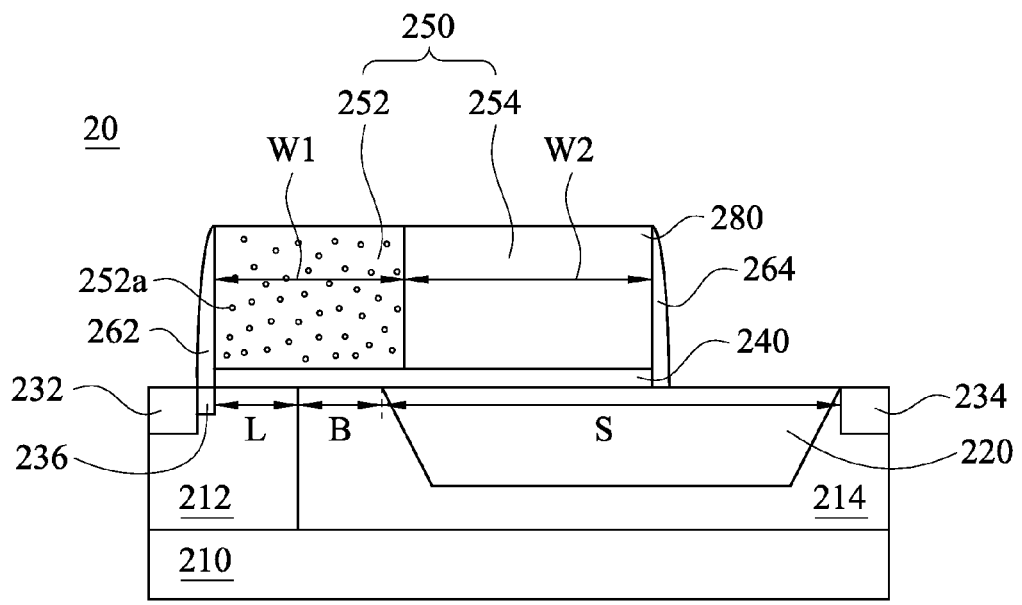

As shown in FIG. 5E, the dopants 252a of the first conductivity type are implanted in a portion 252 of the gate electrode 250 over the channel region 212. In some embodiments, arsenic is employed with a doping concentration from about $10^{13}$ cm$^{-3}$ to about $10^{15}$ cm$^{-3}$ under a condition of less than 60 keV. In some embodiments, it is employed for phosphrous with a doping concentration from about $10^{13}$ cm$^{-3}$ to about $10^{15}$ cm$^{-3}$ under a voltage less than 120 keV. Before implanting the dopants 252a of the first conductivity type, a mask layer (not shown) is formed covering the gate electrode 250, and a portion of the mask layer is then removed to expose the portion 252 of the gate electrode 250.

It is noteworthy that the portion 252 of the gate electrode 250 has a width W1 equal to or greater than a distance L of the gate electrode 250 overlapped with the channel region 212 (i.e., W1≥L). Also, the width W1 is less than a sum of the distance L, the clearance B between the channel region 212 and the isolation region 220, and the lateral dimension S of the isolation region 220 (i.e., W1<L+B+S). In the illustrated embodiment, the width W1 is greater than the distance L plus the clearance B (i.e., W1>L+B).

Figure 5F:
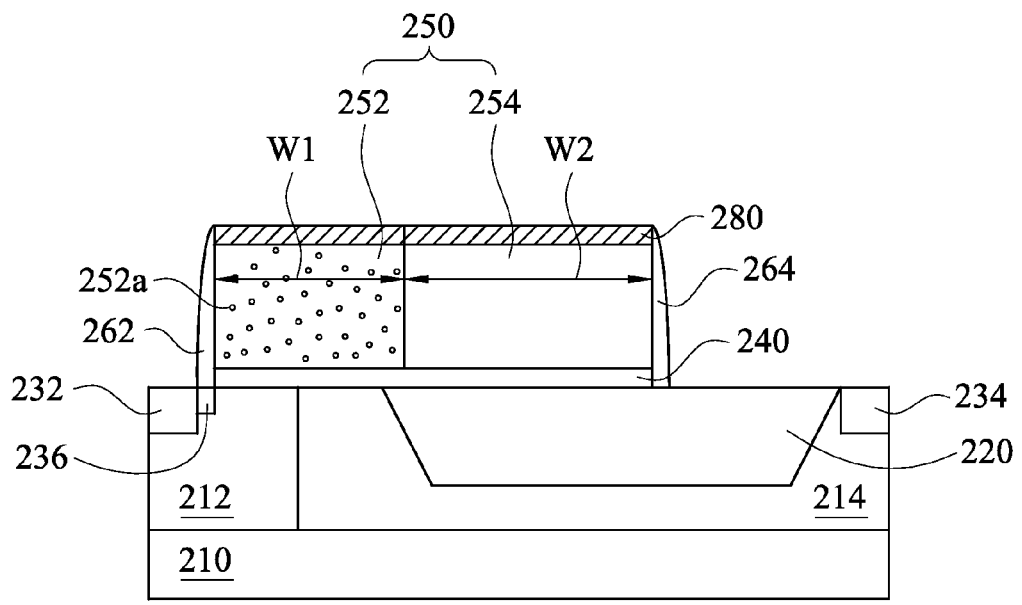

Finally, as shown in FIG. 5F, a field plate 280 is formed on and contacting an upper surface of the gate electrode 250, in which the field plate 280 includes polycide. In one embodiment, forming the field plate 280 on and contacting the upper surface of the gate electrode 250 includes: depositing a metal-containing layer (not shown, e.g., Co, Ti, W or Ni layer) on the upper surface of the gate electrode 250, and then performing an annealing process on the metal containing layer to perform a silicidation reaction between the metal and the gate electrode 250. In one embodiment, the gate electrode 250 includes polysilicon.

Given the above, the embodiments of the present disclosure discussed above have advantages over existing structures and methods. The field plate according to the embodiments of the present disclosure can be formed without a photomask process so as to save production cost and to allow higher process freedom. The field plate directly disposed on the gate electrode according to the embodiments of the present disclosure can be used to reduce the electric field outside the gate electrode so as to improve reliability. Further, a thickness of the un-doped second portion of the gate electrode according to the embodiment of the present disclosure can be adjusted without concerning other process conditions, such that breakdown voltage tuning is easy.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A MOS transistor in a semiconductor substrate, the MOS transistor comprising:
    a source region of a first conductivity type and a drain region of the first conductivity type in the semiconductor substrate;
    a channel region of a second conductivity type opposite to the first conductivity type in the semiconductor substrate between the source region and the drain region;
    an isolation region adjacent to the drain region;
    a drift region of the first conductivity type laterally adjacent to the channel region and beneath the isolation region and the drain region;
    a gate dielectric layer over the channel region and extending over the drift region;
    a gate electrode over the gate dielectric layer having a first portion and a second portion, wherein the first portion of the first conductivity type has a uniform or substantially uniform dopant concentration and is over the channel region and further extends over a portion of the drift region and a portion of the isolation region, the second portion is un-doped and over the isolation region, an interface between the first portion and the second portion is directly overlying the isolation region, and the first portion has a width less than a width of the second portion; and
    a field plate contacting an upper surface of the gate electrode, wherein the field plate comprises polycide.

2. The MOS transistor of claim 1, wherein the gate electrode and the field plate are substantially identical in pattern.

3. The MOS transistor of claim 1, wherein the width of the first portion is less than a sum of the distance of the gate electrode overlapped with the channel region, a clearance between the channel region and the isolation region, and a lateral dimension of the isolation region.

4. The MOS transistor of claim 1, wherein the width of the first portion of the gate electrode is greater than the distance of the gate electrode overlapped with the channel region plus a clearance between the channel region and the isolation region.

5. The MOS transistor of claim 1, wherein the gate electrode has a thickness in a range of 500 to 10,000 angstroms.

6. The MOS transistor of claim 1, wherein the field plate has a thickness in a range of 10 to 300 angstroms.

7. The MOS transistor of claim 1, wherein the polycide is a material selected from the group consisting of cobalt silicide, titanium silicide, tungsten silicide, nickel silicide and a combination thereof.

8. The MOS transistor of claim 1, wherein the gate electrode comprises polysilicon.

9. The MOS transistor of claim 1, wherein the channel region comprises P-type dopants, and the first portion of the gate electrode, the source region, the drain region and the drift region comprise N-type dopants, and the MOS transistor is a laterally diffused metal oxide semiconductor (LDMOS) transistor.

10. The MOS transistor of claim 1, wherein the isolation region is a shallow-trench isolation (STI) region.

11. The MOS transistor of claim 1, wherein the second portion of the gate electrode has a resistance greater than a resistance of the first portion of the gate electrode.

12. The MOS transistor of claim 1, further comprising a spacer laterally adjacent to the gate dielectric layer, the gate electrode and the field plate.

13. The MOS transistor of claim 12, wherein the spacer is in contact with a sidewall of the field plate.

14. The MOS transistor of claim 12, further comprising a lightly doped drain (LDD) region beneath the spacer and adjoining the source region.

15. The MOS transistor of claim 1, wherein a lateral dimension of the isolation region is greater than a clearance between the channel region and the isolation region.

16. The MOS transistor of claim 1, wherein a lateral dimension of the isolation region is greater than a sum of a distance of the gate electrode overlapped with the channel region and a clearance between the channel region and the isolation region.

17. The MOS transistor of claim 1, wherein the gate dielectric layer further extends over a portion of the isolation region.

* * * * *